United States Patent [19]

D'Ortenzio

[11] 4,044,312
[45] Aug. 23, 1977

[54] COMPARISON CIRCUIT FOR REMOVING POSSIBLY FALSE SIGNALS FROM A DIGITAL BIT STREAM

[75] Inventor: Remo J. D'Ortenzio, Rochester, N.Y.

[73] Assignee: Stromberg-Carlson Corporation, Rochester, N.Y.

[21] Appl. No.: 745,442

[22] Filed: Nov. 26, 1976

[51] Int. Cl.² .............................................. H03K 1/10
[52] U.S. Cl. .................................. 328/165; 307/211; 307/247 A; 307/218
[58] Field of Search ................... 307/211, 247 A, 218; 328/165

[56] References Cited

U.S. PATENT DOCUMENTS

| 3,344,353 | 9/1967 | Wilcox | 307/211 X |
| 3,467,956 | 9/1969 | Moreines | 307/211 X |
| 3,749,940 | 7/1973 | Diepart et al. | 307/247 A |
| 3,828,167 | 8/1974 | Goldfarb | 328/165 X |

Primary Examiner—John S. Heyman
Attorney, Agent, or Firm—William F. Porter, Jr.; Hoffman Stone

[57] ABSTRACT

A circuit for eliminating possibly false signals such as those due to contact bounce in electromechanical devices from a stream of digital pulses that represent the instantaneous states of selected conditions at successive intervals. The circuit includes a majority logic detector, two stores, one for storing the input signals, and one for storing the output of the majority logic detector, and means for feeding the input signals and the outputs of the two stores to respective inputs of the detector for comparison.

3 Claims, 2 Drawing Figures

COMPARISON CIRCUIT FOR REMOVING POSSIBLY FALSE SIGNALS FROM A DIGITAL BIT STREAM

BRIEF DESCRIPTION

This invention relates to a novel circuit for removing possibly spurious signals from a series of time-spaced digital signals, and, more particularly, but not necessarily limited to a circuit for use in conjunction with a system for transmitting signals indicating the instantaneous states of sensed conditions of the kind that are characterized by an uncertainty interval immediately following each intended change of state.

Electromechanical devices such as turret keys, hook switches, and relays are still widely used in all modern telephone systems. Primarily because of contact bounce devices of this kind are characterized by a so-call uncertainty interval immediately following each intended change of state, which in general is much shorter than the duration of dwell in either state, yet considerably longer than the reaction time of modern digital supervisory systems.

The circuit of the invention operates to remove signals from the supervisory system that are generated by contact bounce so that the system will react only to intended changes of state of the electromechanical devices.

In modern digital supervisory systems the states of several different pairs of contacts are sampled periodically to produce a multiplexed bit stream in which the successive bits represent the states of the contacts at successive time-spaced intervals; each pair of contacts is, in effect, checked once during each frame of the digital system. The circuit of the invention is intended primarily for use in systems of this kind.

Two conditions must be met to ensure proper operation of the present circuit. First, the uncertainty intervals of the sensed devices must be not greater than one-half the minimum dwell intervals. This condition is almost universally satisfied inherently simply by the nature of the devices used in telephone systems and the functions they serve. The second condition is that the duration of the frame in the digital sampling system must be at least as long as the uncertainty interval but not longer than one-half the minimum dwell interval. With the frame duration at least equal to the uncertainty interval no two successive samples can be taken during an uncertainty interval, and with the frame duration not longer than one-half the minimum dwell interval there will be at least two successive samples during each dwell interval.

The circuit of the invention restricts the supervisory system so that it can indicate a change of state of one of the sensed conditions only when the change is indicated by similar bits in two successive frames of the incoming signal. The circuit is simple and inexpensive. It includes a majority logic detector and two stores each capable of storing a single frame of the digital sampling system. The incoming bit stream is fed simultaneously to the detector and to one of the stores. The output of the detector is fed to the other store, and the outputs of both stores are fed, along with the incoming bit stream to the detector. The output of the detector corresponds to the majority of the signals applied to it, and can indicate a change of state only when the change is signalled by similar bits in two successive frames of the incoming bit stream.

DETAILED DESCRIPTION

A presently preferred embodiment of the invention will now be described in detail in conjunction with the accompanying drawing, wherein.

Figures 1, 2:
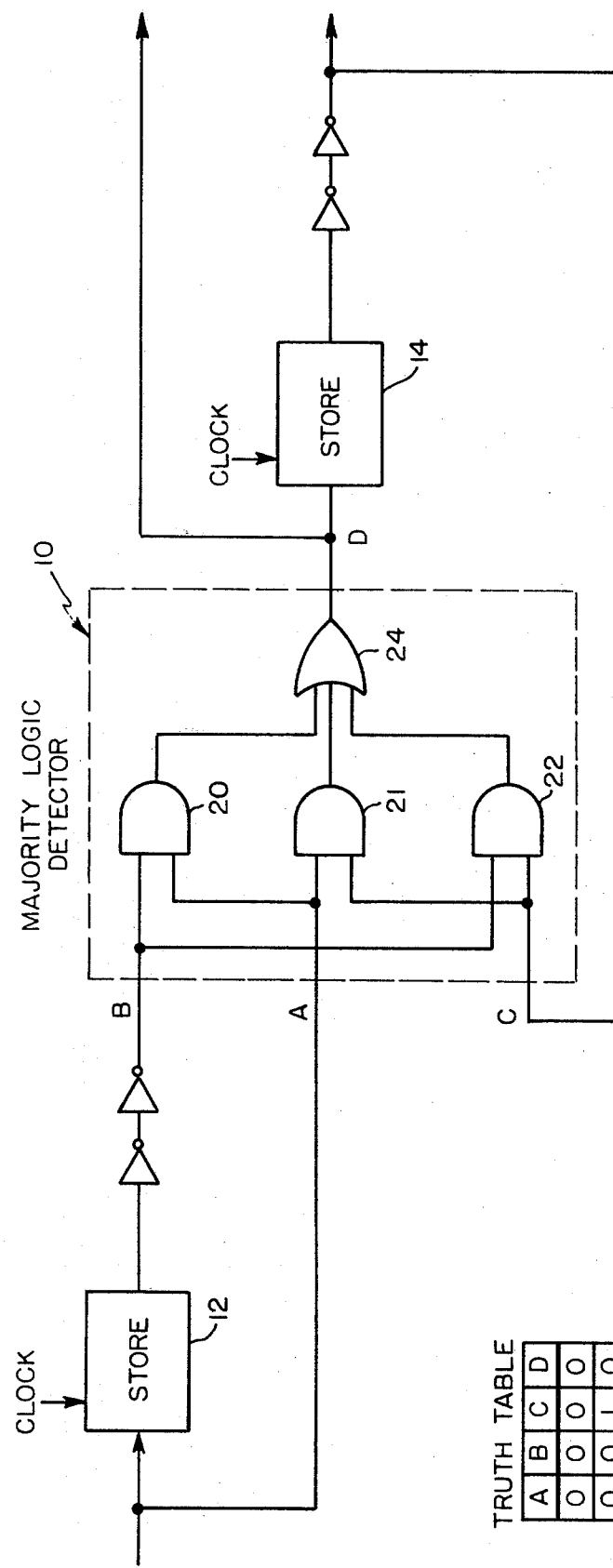
FIG. 1 is schematic diagram of the circuit.
FIG. 2 is a truth diagram illustrating the operation of the majority logic detector portion of the circuit.

In the circuit as shown a multiplexed bit stream including successive pulses which represent the states of various different sensed conditions is fed to a majority logic detector 10, and, simultaneously, to a first store 12. The output of the detector 10 is fed to a second store 14, and the outputs of the two stores 12 and 14 are applied, along with the input signal, to the detector 10.

As shown, the detector 10 is merely an array of three AND gates 20, 21, and 22, respectively, with their outputs combined through an OR gate 24. Each of the AND gates has two inputs, and each of the signals applied to the detector is fed to one input of each of two of the gates 20, 21, and 22. The stores 12 and 14 are clocked synchronously with the timing of the sampling system.

In operation, during any one time slot in the sampling frame the detector produces an output bit corresponding to the state indicated by the majority of the bits appearing at its input, which are (1) the most recent sample of the sensed condition, (2) the sample from the first store 12, which was taken during the next preceding frame, and (3) the bit from the second store 14, which is the output bit produced by the detector 10 during that next preceding frame. Whenever successive output bits from the detector that represent the state of any particular sensed condition are continuously repetitive, the output of the detector is clearly stable. Whenever a false signal causes a change to occur in the input stream for any one sensed condition it will be suppressed by the detector 10 as shown in the truth table of FIG. 2, but whenever two successive bits indicate a change of state of the sensed condition the output of the detector 10 will also indicate the change.

The outputs of the detector 10 and of the second store 14 indicate the instantaneous states (although delayed by one or two frames) of the sensed conditions. If it is desired to detect changes of state directly, the outputs of the detector 10 and second store 14 may be applied to an EXCLUSIVE OR circuit, the output of which will signal the occurrences of intended changes of states.

As a practical example, the uncertainty intervals of the sensed conditions may be assumed to be at most six milliseconds, the dwell intervals to be at least thirty milliseconds, and the number of sensed conditions provided for to be one hundred twenty eight. The duration of the frame of the sampling system may then be chosen at any value between six and fifteen milliseconds. If one chooses a frame of 12.8 milliseconds, a convenient clock rate of ten kiloHertz is arrived at, permitting all 128 conditions to be sensed in succession and their states indicated by successive bits in a ten kiloHertz multiplexed bit stream.

The invertors shown but not designated by reference numerals are not necessary components of the circuit, but were included in a practical embodiment to provide sufficient power to feed the inputs of two of the gates 20–21, the outputs of the stores 12 and 14 being inadequate in the particular integrated circuit components that were used.

What is claimed is:

1. A comparison circuit for removing possibly false signals from a digital bit stream comprising first and second stores each capable of storing one frame of a selected bit stream, comparison means for producing an instantaneous output signal corresponding to the states of a majority of three input signals, means for applying the selected bit stream to said comparison means and simultaneously to said first store, means for applying the output of said comparison means to said second store, and means for applying the outputs of both said first and second stores to said comparison means.

2. A comparison circuit for use in conjunction with a supervisory system of the kind in which the respective states of a plurality of conditions are indicated by respective bits in a repetitive digital bit stream, the comparison circuit being effective to ensure that the supervisory system does not react to a change of state of one of the conditions unless the change is indicated by a bit in each of two successive frames of the bit stream, said comparison circuit comprising first and second stores each capable of storing one frame of the digital bit stream, a majority logic detector for producing an output bit corresponding to the majority of three bits applied at its input, means for applying the output of said detector to said second store, means for applying the digital bit stream to said detector and to said first store, and means for applying the outputs of said first and second stores to the input of said detector.

3. A comparison circuit according to claim 2 wherein said majority logic detector comprises three AND gates each having two input terminals, means for applying the digital bit stream to one input terminal of each of two of said gates, means for applying the outputs of said first and second stores each to one input terminal of each of two of said gates, only one signal being applied to each of the input terminals of said gates, and means for combining the outputs of said gates.

* * * * *